(12) United States Patent
Oikonomakos

(10) Patent No.: US 8,640,004 B2
(45) Date of Patent: Jan. 28, 2014

(54) DATA REARRANGEMENT FOR DECODER

(75) Inventor: Petros Oikonomakos, Valby (DK)

(73) Assignee: Nokia Corporation, Espoo (FI)

( * ) Notice: Subject to any disclaimer, the term of this patent is extended or adjusted under 35 U.S.C. 154(b) by 291 days.

(21) Appl. No.: 13/266,011

(22) PCT Filed: Apr. 24, 2009

(86) PCT No.: PCT/FI2009/050330
§ 371 (c)(1),
(2), (4) Date: Oct. 24, 2011

(87) PCT Pub. No.: WO2010/122210
PCT Pub. Date: Oct. 28, 2010

(65) Prior Publication Data
US 2012/0054579 A1    Mar. 1, 2012

(51) Int. Cl.
*H03M 13/00* (2006.01)
(52) U.S. Cl.
USPC ........................................... 714/760
(58) Field of Classification Search
USPC ........................................... 714/760
See application file for complete search history.

(56) References Cited

U.S. PATENT DOCUMENTS

| 4,875,206 | A | * | 10/1989 | Nichols et al. ........... 370/427 |
| 6,072,796 | A | * | 6/2000 | Christensen et al. ......... 370/379 |
| 6,392,572 | B1 | | 5/2002 | Shiu et al. |
| 6,996,767 | B2 | | 2/2006 | Chang et al. |
| 7,839,310 | B2 | | 11/2010 | Nieminen |
| 8,051,239 | B2 | | 11/2011 | Nieminen |
| 8,090,896 | B2 | | 1/2012 | Nieminen |
| 2003/0028843 | A1 | | 2/2003 | Chang et al. |
| 2003/0193939 | A1 | * | 10/2003 | Henrion .................. 370/389 |

FOREIGN PATENT DOCUMENTS

| CN | 1246244 | A | 3/2000 |
| CN | 1725647 | A | 1/2006 |
| EP | 1450494 | A1 | 8/2004 |
| EP | 1583273 | A2 | 10/2005 |
| EP | 1619802 | A1 | 1/2006 |
| WO | 98/27741 | A1 | 6/1998 |
| WO | 00/59118 | A1 | 10/2000 |

OTHER PUBLICATIONS

International Search Report and Written Opinion recieved for corresponding Patent Cooperation Treaty Application No. PCT/FI2009/050330, dated Feb. 2, 2010, 11 pages.
Lee et al., "Forward Error Correction Decoding for WiMAX and 3GPP LTE Modems", Systems and Computers, 42nd Asilomar Conference on Oct. 26-29, 2008, 5 pages.
Office Action received for corresponding Chinese Patent Application No. 200980158889.3, dated Jun. 27, 2013, 7 pages.
European Search Report received for corresponding European Patent Application No. 09843592.8, dated Jun. 24, 2016, 6 pages.

(Continued)

*Primary Examiner* — Albert Decady
*Assistant Examiner* — Enam Ahmed
(74) *Attorney, Agent, or Firm* — Nokia Corporation

(57) ABSTRACT

There is provided a solution for rearranging data to a decoder of a receiver. The solution comprises receiving data, writing the data to one or more memory slots in parts, first in an ascending order of addresses and then in a descending order of addresses. The solution further comprises reading the full memory slots in a descending order of addresses and forwarding the read data to the decoder.

19 Claims, 3 Drawing Sheets

(56) References Cited

OTHER PUBLICATIONS

Schurgers et al., "Memory Optimization of MAP Turbo Decoder Algorithms", IEEE TRansactions on Very Large Scale Intergration (VLSI) Systems, vol. 9, No. 2, Apr. 2001, 8 pages.

Sun et al., "Configurable and Scalable High Throughput Turbo Decoder Architecture for Multiple 4G Wireless Standards", IEEE International Conference on Application-Specific Systems, Architectures and Processors, 2008, 6 pages.

* cited by examiner

DATA REARRANGEMENT FOR DECODER

RELATED APPLICATION

This application was originally filed as PCT Application No. PCT/FI2009/050330, filed Apr. 24, 2009.

FIELD

The invention relates generally to data arrangement in a receiver. More particularly, the invention relates to data rearrangement for a turbo decoder employed in a receiver of a mobile communication network.

BACKGROUND

In a wireless radio communication system, a communication link consists of a transmitter, receiver and the propagation channel connecting these two. The propagation channel is not ideal in the sense that it causes interference to the transmitted signal, which results in that the received data is corrupt which affects the receiver's performance of detecting and outputting correct data bits/symbols. For this reason, various methods are used in the transmitter and receiver. One of these is the use of channel error correction codes. Error correction is applied as channel encoding to the transmitter and a decoding to the receiver. The purpose for encoding is to add redundancy to the transmitted data in a controlled matter. Often this denotes transmitting m information bits in n bits, thus yielding a code rate of m/n. The added redundancy may be parity information, for example. A parity bit informs how many bits of "1" there should be in the received data. In practice, channel encoding increases the distance between the transmitted symbols in the signal space.

One example of the error correction codes are turbo codes which require a turbo coder and a turbo decoder to be employed in the transmitter and in the receiver, respectively. As shown in FIG. 1A, the encoder 140 utilizes two identical convolutional encoders 106 and 110 concatenated together via parallel concatenation and separated by an interleaver 108. In an example implementation, the turbo decoder 150, shown in FIG. 1B, also comprises two decoders 116 and 120 concatenated together via serial concatenation and separated by an interleaver 118. The first decoder 116 outputs a soft decision of the transmitted bit and the second decoder 120 yields a hard decision 130, i.e., the transmitted bit. The decoder 150 may also apply a feedback loop 112 for iterating the decoding process in order to enhance the reliability of the hard decision 130.

The drawback of the turbo decoder 150 is its high complexity and high latency, which consists of delays generated by the first decoder 116, the second decoder 120 and the way the input data is fed to the decoder 150. That is, the decoder 150 requires the data to be fed in a certain order. This is not a trivial operation and causes delays in the operation. However, a latency-minimized operation is essential for many applications in order to provide adequate data throughput. For this reason, a solution is needed to reduce the delays needed for the decoding process.

BRIEF DESCRIPTION OF THE INVENTION

An object of the invention is to provide a solution for data arrangement for a decoder.

According to an aspect of the invention, there is provided a method as specified in claim 1.

According to an aspect of the invention, there are provided apparatuses as specified in claims 13 and 25.

According to an aspect of the invention, there is provided a computer program product as specified in claim 26.

Embodiments of the invention are defined in the dependent claims.

LIST OF DRAWINGS

In the following, the invention will be described in greater detail with reference to the embodiments and the accompanying drawings, in which FIG. 1A presents a turbo encoder;

FIG. 1B presents a turbo decoder;

Figure 3A:
FIG. 3A shows a trellis diagram according to an embodiment.
Figure 3B:
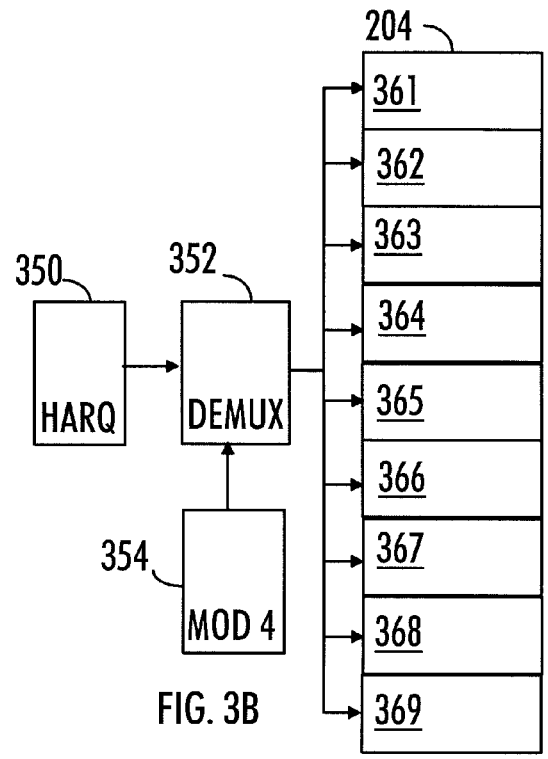
Figure 4:
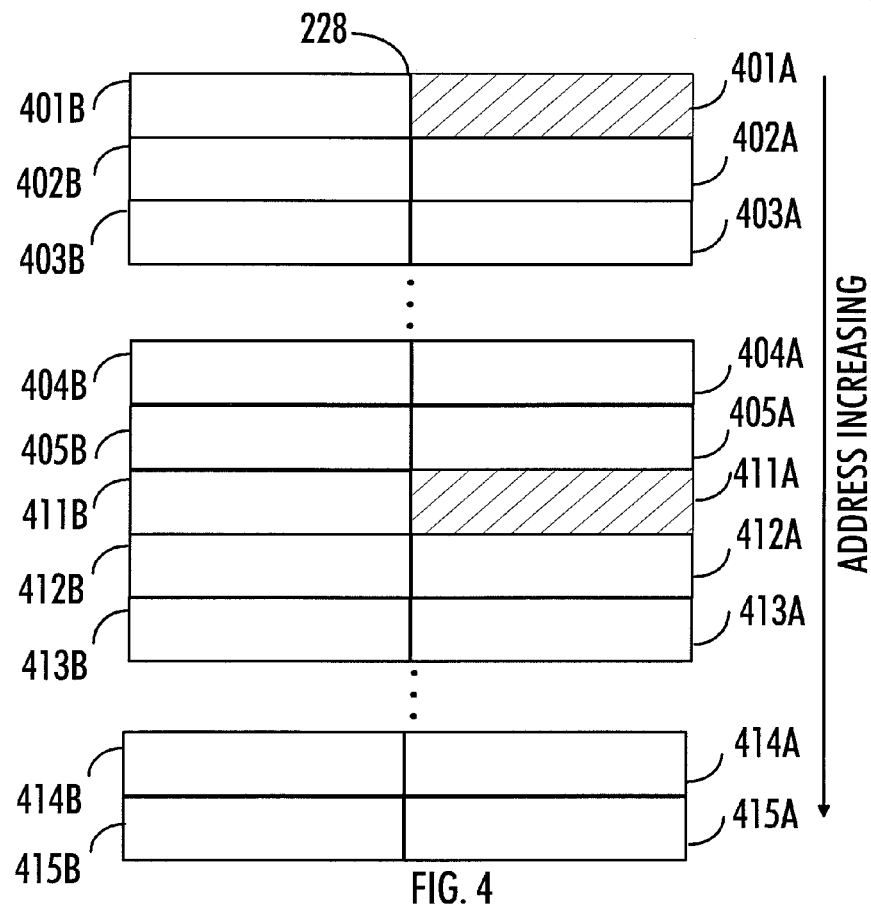
Figure 5:
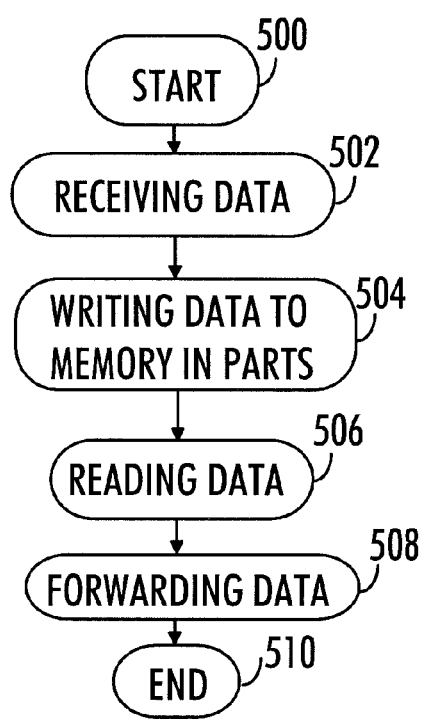
Figure 6:
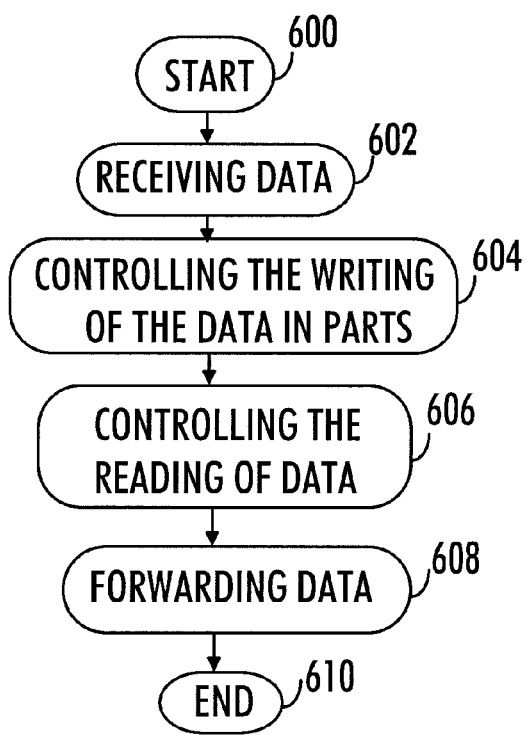

FIG. 3B presents a temporary register according to an embodiment;

FIG. 4 illustrates a memory according to an embodiment;

FIG. 5 illustrates a method for rearranging data according to an embodiment; and FIG. 6 illustrates a method for rearranging data according to an embodiment.

DESCRIPTION OF EMBODIMENTS

The following embodiments are exemplary. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

Although this invention is described using the Long Term Evolution (LTE) or the LTE-Advanced (LTE-A) of the $3^{rd}$ Generation Partnership Project (3GPP) as a basis, it could be applicable to any other wireless mobile communication systems as well. For example, the embodiments may be applied under the UMTS or the Global system for mobile communications (GSM). The telecommunication system may have a fixed infrastructure providing wireless services to subscriber terminals.

Figure 1A:
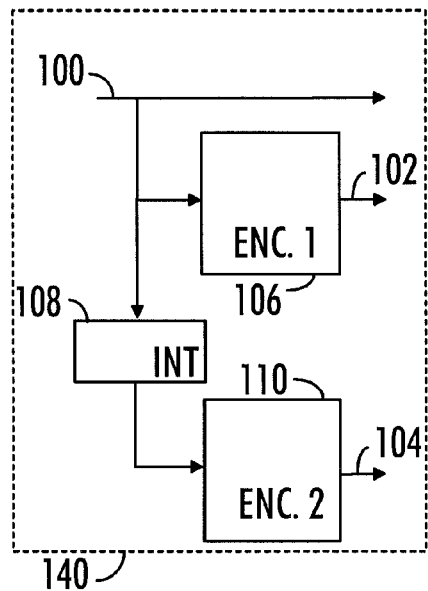

FIG. 1A shows a turbo encoder 140 according to an embodiment. As mentioned, the encoder 140 comprises two convolutional encoders 106 and 110 concatenated together but separated by an interleaver 108. The interleaver 108 is used to randomize the errors, which usually happen in bursts. Without the interleaver 108, a certain part of the received data might suffer from severe errors that might be unrecoverable. The interleaver 108 changes the order of the transmitted bits such that even though the errors may happen in bursts, after deinterleaving at the receiver, the corrupted bits may not be adjacent to each other but spread over the received data, in which case it may be possible to correct the errors.

The encoder 140 of FIG. 1A outputs three blocks of bits: a sub-block of data 100 without any modifications, a first sub-block of parity bits 102 and a second sub-block of parity bits 104. Thus, the code rate of the encoder 140 of FIG. 1A is ⅓. The output that is formed from the three sub-blocks may be called a code block. The code block may be a string of characters with a certain specific length which have been encoded and transmitted to a receiver. The data 100 without any modifications may also be called the systematic part of the code block. The encoders 106 and 110 may be for example 8-state encoders, each having three memory registers. The detailed structure of the encoders 106 and 110 is not shown here.

Since the encoder 140, as shown in FIG. 1A, is a finite state machine, the function of the encoder 140 can be depicted with a trellis diagram. The trellis diagram shows all the possible states that can be generated when the memory registers contain a certain starting point. The use of a trellis diagram is justified since not all transitions are possible. For example, assume a convolutional encoder with three memory registers of $k_0$, $k_1$ and $k_2$, containing bits "1", "1", and "0" in the registers $k_0$, $k_1$ and $k_2$, respectively (state "110"). On the basis of an input bit (in the input of register $k_0$) the registers $k_0$, $k_1$ and $k_2$ of the encoder at the next turn can convert either to state "011" or to state "111". Other states, for example "110" or "100", are not possible. The decoding algorithms also exploit this idea: if a received sequence does not fit into some of the paths in the trellis diagram, then it was received with errors. Consequently, the nearest correct path that fits the diagram should be chosen.

After the systematic data 100 have all been fed to the convolutional encoders 106 and 110, the last contents of the last 1-bit register of each encoder may be fed back to the input of the encoder. This procedure may be repeated for a number of clock cycles that are equal to the encoder length (number of registers). This procedure is called trellis termination and it results in the all-0s pattern in the encoder registers. It also produces a number of additional encoder outputs, which are called tail bits. The tail bits may be appended to the data bits 100, 102 & 104 in some agreed order (after the rest of the bits, for example) and transmitted together with the rest of the bits.

Figure 1B:
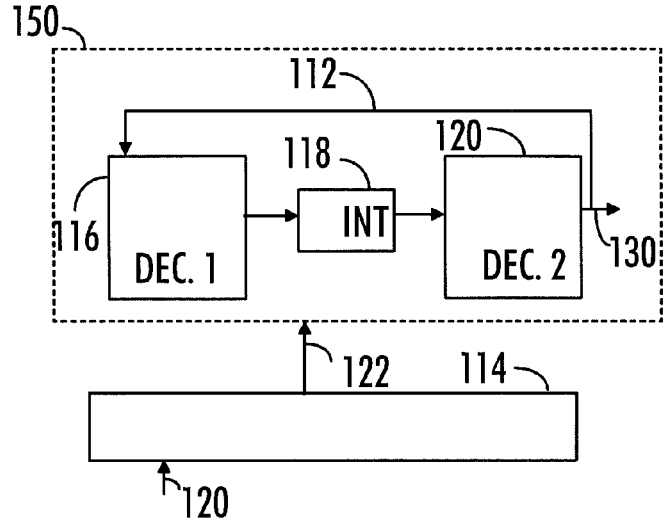

The turbo decoder 150 shown in FIG. 1B typically also comprises a data insertion module or a data loader 114, which is a block that receives data 120 from a hybrid automatic repeat request (HARQ) and rearranges the data into turbo core memories in an appropriate fashion. The data 120 may include the sub-block of data 100, the first sub-block of parity bits 102 and the second sub-block of parity bits 104. That is, it may feed the sub-blocks 100, 102 and 104 to the turbo decoder 150 via a data input line 122 after rearranging the data 120.

According to the LTE turbo decoding algorithm, in each cycle the turbo decoder 150 should receive data corresponding to eight trellis columns, that is, four columns on the "left-hand side" of the trellis and their "mirror image" on the "right-hand side" of the trellis. However, the data 120 arrives serially from HARQ; therefore the first requirement for the data loader 114 is to rearrange them in such a way that they can be readily used by the decoding algorithm. Due to the requirements of the decoder 150, the data loader 114 cannot simply write the data 120 to be decoded to an empty memory word and then read and feed the data from the memory to the decoder 150 on a memory slot by memory slot basis.

According to an embodiment, the decoder structure requiring the data loader 114 may be present in any apparatus where incoming data needs to be decoded. For example, the data loader 114 may be in a base station, in an evolved node B (eNB), in a radio network controller (RNC), in a user terminal, in a palm computer, in a mobile phone.

Figure 2:
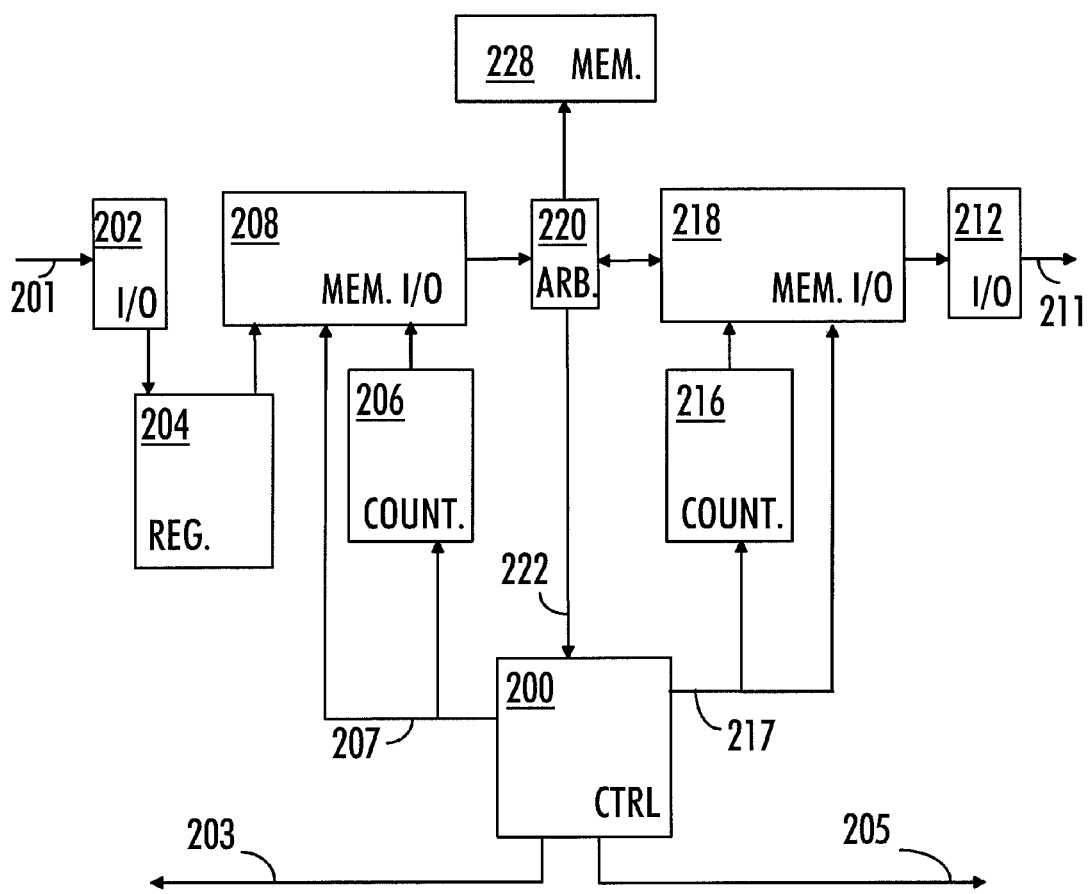
FIG. 2 shows an apparatus for rearranging data according to an embodiment.

An example of a very general architecture of an apparatus capable of rearranging the data to the decoder is shown in FIG. 2. FIG. 2 shows only the elements and functional entities required for understanding the apparatus according to an embodiment of the invention. Other components have been omitted for reasons of simplicity. The implementation of the elements and functional entities may vary from that shown in FIG. 2. The connections shown in FIG. 2 are logical connections, and the actual physical connections may be different. It is apparent to a person skilled in the art that the apparatus may also comprise other functions and structures.

The apparatus of FIG. 2, which may also be called a data loader, for rearranging data may comprise a processor 200. The processor 200 may be implemented with a separate digital signal processor provided with suitable software embedded on a computer readable medium, or with a separate logic circuit, such as an application-specific integrated circuit (ASIC). The processor 200 may comprise an interface, such as a computer port, for providing communication capabilities.

The functionalities of the apparatus of FIG. 2 may be effectively split between two parts, a first part that receives data from HARQ and writes them into a memory, and a second part that reads the memory simultaneously after a period of a predetermined number of clock cycles and feeds the data to the rest of the design. Let us discuss these parts more thoroughly.

The apparatus may further comprise interfaces 202 and 212 for inputting and outputting data 201 or 211, respectively. According to an embodiment, the data 201 is received from the HARQ buffers. Thus, the interface 202 may be simply a computer port for providing communication capabilities. Similarly, the interface 212 may be simply a computer port for providing communication capabilities. The interface 212 may feed data 211 to the rest of the design such as to the decoder. Even though FIG. 2 shows two interfaces 202 and 212, the apparatus could comprise only one interface for performing both the input and the output of data under the control of the processor 200. However, for the sake of clarity, let us assume there are two interfaces 202 and 212.

According to an embodiment, the interface 202 receives at least one data sample 201 over a predetermined number of clock cycles. The at least one data sample 201 may comprise at least one of the following: at least one systematic bit and at least one parity bit. In other words, the at least one data sample may include the sub-block of systematic data, the first sub-block of parity bits and the second sub-block of parity bits. Let us call the sub-block of data a softbit from now on. One soft bit may comprise a varying number of bits, for example 4 bits, 5 bits or 6 bits. That is, the width of a softbit ($S_w$) may, in that case, be 4, 5 or 6 bits, respectively.

The softbits, including for example the systematic softbit, the first parity softbit and the second parity softbit, may be received at each clock cycle. However, the interface 202 may receive also other information at each clock cycle, if needed. For the sake of clarity of the description, let us assume that the data loader receives only the three softbits mentioned above at each clock cycle. The three softbits may correspond to one column of the trellis diagram. That is, the apparatus of FIG. 2 may receive data corresponding to one trellis column each clock cycle.

According to an embodiment, the interface 202 receives the at least one data sample over a predetermined number of clock cycles. Let us assume, for the sake of clarity of the description, that the predetermined amount of clock cycles is four. Consequently, the data loader receives 12 softbits during the period of four clock cycles, three softbits at each of the four clock cycles. In other words, the data loader collects the systematic softbit, the first parity softbit and the second parity softbit from four adjacent trellis columns, thus resulting in 3×4=12 softbits.

According to an embodiment, the data loader stores to a temporary register the at least one data sample received over the predetermined number of clock cycles minus one. That is, if the predetermined number of clock cycles is four, then the data received over three clock cycles is stored to the temporary register. Assuming that the HARQ provides three softbits every cycle (the systematic softbit, the first parity and the second parity softbits), the temporary buffer/register of size $3*3*S_w=9*S_w$ is needed. This kind of register 204 is shown in FIG. 3B. The register is also shown in FIG. 2.

FIG. 3A shows a trellis diagram with 32 columns marked with reference numbers 301 to 332. Looking at FIGS. 3A and 3B, according to an embodiment, at a first clock cycle the data loader receives at least one data sample (for example, three softbits) from the first column 301 of the trellis diagram and stores the received three softbits to the register 204 of FIG. 3B. The data is received from the HARQ 350 and a de-multiplexer 352 sorts out in which register slots 361 to 369 the data is stored. Over the first clock cycle, the three softbits received may be stored in register slots 361 to 363, for example. However, the data could be stored in other register slots as well, for example, 367 to 369 or to three arbitrarily selected slots. At the next clock cycle, the three softbits from the trellis column 302 are received and stored temporarily in the register slots 364 to 366. During a third clock cycle, register slots 367 to 369 may be occupied with the softbits from the third trellis column 303. This way, the register 204 groups together nine softbits received during three clock cycles. The cycles may be consecutive clock cycles, for example.

The processor 200 of the data loader of FIG. 2 writes the received at least one data sample to a memory 228 comprising one or more memory slots at the last clock cycle of each predetermined number of clock cycles such that first parts of the predetermined one or more memory slots are filled in an ascending order of addresses and, after the predetermined one or more memory slots are filled in respect of the first part, second parts of the predetermined one or more memory slots are filled in a descending order of addresses, wherein a part of a memory slot stores the at least one data sample received over the predetermined number of clock cycles. Further, the processor 200 further reads the written data samples from the predetermined one or more memory slots in a descending order of addresses once the first part and the second part of at least one memory slot are written, wherein the reading takes place during the clock cycles during which data is not being written to the memory 228.

The memory 228 is shown in FIG. 4. The memory 228 can be of any size (any number of slots/words). In addition, the memory 228 can be any kind of standard random access memory (RAM) with bit-write enable functionality. According to an embodiment, the memory has only one port for accessing it in inputting and/or outputting data. In other words, the processor 200 may access the memory for inputting and/or outputting data via the single port.

According to an embodiment, one implementation of the memory 228 is to set the memory bit-width to $3*8*S_w$, where $S_w$ is the width of the softbit. Such a memory width allows the storage of softbits related to eight trellis columns in one memory word, assuming that each trellis column provides three softbits (for example, the systematic softbit, the first parity softbit and the second parity softbit). In other words, one memory slot, comprising a first part A and a second part B, has a width of $3*8*S_w$ bits. The memory 228 comprises one or more memory slots 401 to 415, each having two parts, the first part A and the second part B.

According to an embodiment, the first part A is the least significant half of the memory slot and the second part B is the most significant half of the memory slot. One part of a memory slot 401 to 415 can accommodate the at least one data sample received over the predetermined number of clock cycles. That is, for example 12 softbits. However, a part can store even more data if needed.

The memory slots 401 to 415 are identified with an address. In FIG. 4, the address of the memory slot increases such that the address of the memory slot 401 is lower than the address of the memory slot 402, and so on. Thus, according to the exemplary memory of FIG. 4, the lowest address of the memory 228 belongs to the memory slot 401, whereas the highest address belongs to memory slot 415.

According to an embodiment, the at least one data sample received over the predetermined number of clock cycles corresponds to a part of a code block. The code block may be a certain number of bits/softbits that need to be decoded at the decoder. The predetermined one or more memory slots to be written may be determined based on the knowledge of the code block size. The information of the code block size N may be obtained from a software configuration part of the design. Using N, the processor 200 may calculate the required memory slots and their addresses, and the total number of softbits that will be received from HARQ in relation to the current code block. For example, if the code block size N corresponds to 32 trellis columns (as is the case in FIG. 3A), then the predetermined one or more memory slots reserved for the code block include four memory slots, assuming one memory slot can occupy softbits corresponding to eight trellis columns. Thus, for example, memory slots 402 to 405 could be used to occupy data corresponding to the code block. Then memory slots 412 to 415 can be used for the data corresponding to the next adjacent code block. According to an embodiment, the memory slots 401 and 411 are used for other purposes as will be described later.

Looking at FIGS. 2 and 4, according to an embodiment, after the nine softbits received over the three clock cycles of the predetermined number of clock cycles are stored in the register 204 and another three softbits (corresponding in trellis column 304 of FIG. 3A) at the last clock cycle of the predetermined number of cycles (fourth clock cycle) are received, the processor 200 writes the stored/buffered contents (nine softbits) together with the newly received triplet of softbits to the first part A of the memory slot 402 of the memory 228. That is, altogether 12 softbits are written to the memory slot 402A on the last clock cycle of the predetermined number of clock cycles (fourth clock cycle).

Before accessing the memory for the next time, a predetermined number of clock cycles is allowed to pass in order to allow the reception of another 12 softbits (nine newly stored in the register 204 and three received during current clock-cycle) corresponding to the next four trellis columns. For the second set of 12 softbits, the corresponding trellis columns are columns 305 to 308. Consequently, on the last clock cycle of the ongoing predetermined number of clock cycles, these 12 softbits are written to the memory slot 403A.

According to an embodiment, the processor 200 increments the address of the specific memory slot in which the received softbits are written at the last clock cycle of each predetermined number of clock cycles until the number of write operations reaches a predetermined threshold T. The predetermined threshold T may be the midpoint of the trellis diagram in columns. That is, when data corresponding to half of the trellis columns are written to the first parts of the memory, the threshold T is reached. The half of the trellis columns may be the "left-half" of the trellis columns. In FIG. 3A, the half of the trellis columns are columns 1 to 16 marked with reference numbers 301 to 316. Looking at FIG. 4, the threshold T corresponds to the memory slot 405 when the data of the first code block is being rearranged. That is, when the memory slot 405 is written, the incrementing of the memory address is stopped. For the data corresponding to the second code block, the threshold T is the memory slot 415. In other words, the processor 200 keeps doing the writing while incrementing the address in which the data is written until the trellis midpoint is reached. The processor 200 may increment the address by using a counter 206. This way the processor 200 keeps writing the received softbits to the memory 228 in an ascending order of addresses.

According to an embodiment, after the predetermined one or more memory slots 401 to 415 are filled in respect of the first part A, second parts B of the predetermined one or more memory slots 401 to 415 are filled in a descending order of addresses. That is, from the midpoint onwards, data collected during the predetermined number of clock cycles is written to the second part B of a memory slot/word 401 to 415, while decrementing the address for writing the data. The first time when the second part of a specific memory slot is accessed for writing, is when the first part A of the memory slot 405 is written and the next set of softbits is received. Then the processor 200 writes the received softbits to the second part B of the memory slot 405. The data that is written to the memory slot 405B corresponds to the next four trellis columns from the trellis midpoint onwards. Looking at FIG. 3A, the corresponding trellis columns are columns 17 to 20 (17=32/2+1 and 20=32/2+4), marked with reference numbers 317 to 320.

According to an embodiment, the processor 200 informs the counter 206 at this point that a downcount is required. In other words, the processor 200 decrements the address of the specific memory slot 401 to 415 in which the received at least one data sample is written after the predetermined threshold T is reached and until the data samples corresponding to the current code block are written. Consequently, after the next predetermined number of clock cycles has passed, the processor 200 accesses the memory slot 404B for writing. This way the processor 200 keeps writing the received softbits to the memory 228 in a descending order of addresses.

As a result the necessary rearrangement is achieved, where one memory slot 401 to 415 corresponds to four adjacent trellis columns from the left-hand side of the trellis (for example columns 1 to 4) stored to the part A of the memory slot 402, and to their mirror images from the right hand side of the trellis (columns 29 to 32, assuming the trellis has 32 columns) stored to the part B of the memory slot 402. However, the memory 228 is not accessed for writing at every clock cycle but only every fourth clock cycle, as explained above. This leaves time for accessing the memory for reading without waiting for all the data to be received and written before the reading can take place.

The procedure of writing to the first part A of the memory slots 401 to 415 goes on for N/8 write operations, where N is the number of trellis columns in the trellis diagram. This is because during one write operation four sets of softbits corresponding to four trellis columns are written to the first parts A of the memory 228. After the N/8 write operations, another four sets of softbits corresponding to four mirror-imaged trellis columns are written to the second parts B of the memory 228 during another N/8 write operations. Altogether this means that one memory slot contains data corresponding to eight trellis columns.

According to an embodiment, the processor 200 may simply control the writing of the data to the memory 228 via a control line 207. The memory 228 may be accessed via a memory interface 208, which implements a "FIFO-like" mechanism to access the memory. The memory interface 208 may receive the data to be written to the memory 228 from the register 204, whose operation has already been described in relation to FIG. 3, and from the interface 202.

The processor 200 may read at least one full memory slot once the first part A and the second part B of the at least one memory slot are written. In practice the first memory slot to be read is the memory slot 405 since it is the first one whose first A and second B parts are written. In other words, reading of the written data samples from at least one memory slot starts with the memory slot having an address corresponding to the predetermined threshold T. Further, the reading may begin while the writing of the data corresponding to the current code block is not finished. This is possible because the writing occupies only a portion of the total clock cycles reserved for the code block. In other words, the reading takes place during the clock cycles when data is not being written to the memory 228. Assuming that the data is being written to the memory 228 only every fourth cycle, the data can be read during the three cycles data is not being written. That is, the data is being read while at least one second part B of the predetermined one or more memory slots 401 to 405 reserved for the current code block is empty. According to an embodiment, the data is read on a memory slot by memory slot basis.

The reading takes place in a descending order. That is, after the memory slot 405 is read, the memory slot 404 is read next. In order to do this, the processor 200 decrements the address of the memory slot to be read until the data samples corresponding to the current code block are read. The processor 200 may apply a counter 216 for performing countdown operation.

According to an embodiment, the processor 200 may simply control the reading of the data from the memory 228 via the control line 217. The memory 228 may be accessed via a memory interface 218, which implements a "FIFO-like" mechanism to access the memory.

When the predetermined threshold T is reached, the processor 200 knows that reading can begin. For example, the memory interface 208 informs that at least one memory slot 401 to 415 has both parts (the first part and the second part) written with data. The informing may take place by means of a "flag" being raised that informs that from now on there are full slots/words in the memory 228 that can be read and processed further.

If at some point all full words have been read but a whole code block of data has not been received or written yet, the relevant flag is lowered and the reading will halt until a further second part B of a memory slot 401 to 415 is written, so that at least one full memory word is ready in the memory 228 again. This way, data transfer from the buffer memory 228 to the decoder can finish very quickly after the data has been received from HARQ, so that turbo decoding can start without any additional delay that would be incurred if the reading of data needed a separate set of steps. It is desired to start turbo decoding only a few clock cycles after the last data sample was received from HARQ. This is not a trivial task in the LTE, because of the requirement to rearrange data to the decoder, which dictates intermediate buffering. According to an embodiment, the reading can be finished after 2 or 3 clock cycles have passed from the point of time when all data corresponding to the current code block has been received from the HARQ.

Consequently, after the data samples have been read from at least one memory slot, the interface 212 forwards the read data samples 201 from the predetermined one or more memory slots to the rest of the apparatus, which may comprise a decoder, for example.

The first half A of the memory slots with the lowest address among the memory slots reserved for each code block is not used in storing the softbits. That is, in FIG. 4, the first parts A of memory slots 401 and 411 remain unused. The second parts B of the memory slots 401 and 411 are, however, reserved for storing tail bits of the encoder. Remembering that the encoder can be depicted in the form of trellis diagram, trellis termination is performed by taking the tail bits from the encoder registers after all information bits are encoded. Because of the unused first part A and second part B reserved for tail bits, the processor 200 writes, according to an embodiment, the first received at least one data sample over the predetermined number of clock cycles to the first part A of the memory slot with the second lowest address (the memory slot 402 or 412) among the addresses used for the data samples corresponding to the current code block. When the interface 202 receives at least one tail data sample corresponding to the current code block, the processor 200 writes the received at least one tail data sample to the second part B of the memory slot with the lowest address (memory slot 401 or 411) among the addresses used for the current code block. For this reason, the write operations in a descending order of addresses will last for N/8+1 write operations as opposed to the N/8 write operations performed during the writing of data in an ascending order of addresses.

In addition, the processor 200 needs to handle continuous reception of code blocks. In particular, immediately after the reception of one code block, the processor 200 should be able to start rearranging data from the next block. Consequently, when the predetermined threshold T is reached and the writing starts in a descending order of addresses, the processor 200 makes note of the current memory address $D_c$. According to an embodiment, after a full code block has been received and the next one starts coming, the processor 200 starts filling the memory from address $D_c+1$ onwards, since it is from that address onwards that the memory has empty space. Therefore, reception and rearranging of the next block can proceed regardless whether the reading of the last code block has been finished or not. In other words, the processor is aware of the current code block size/length, so that as soon as a full block has been received, the writing of another code block can start from the address $D_c+1$ (=N/8+2).

Consequently, according to an embodiment, once the interface 202 receives at least one data sample corresponding to a new code block, the processor 200 performs write operations for the code block such that writing is started from a memory slot with an address which corresponds to the predetermined threshold T in the last code block and is incremented by one. Further, the reading of another code block starts from address 2*(N/8+1), once there are full memory words/slots ready to be read.

When writing operations reach the highest buffer memory address of the memory (the memory slot 415 in FIG. 4), it can return to the beginning (the memory slot 401) and continue the process seamlessly. This will take place only if the previous contents of the memory slot 401 have already been read. According to an embodiment, the processor 200 re-uses the memory 228 by starting from the memory slot 401 with the lowest address after the memory slot 415 with the highest address has been written.

The apparatus of FIG. 2 may comprise an arbiter. The arbiter 220 collects together the write and read access signals and compacts them into a single memory interface according to the particular memory vendor's requirements. The arbiter 220 gives priority to write accesses. That is, in the event that both write and read accesses are attempted, then the write access will go through.

The arbiter 220 may transmit the number of read and write operations to the processor 200 via a control line 222 in order to inform the processor 200 about the status of the memory. This way the processor 200 keeps track of the write and read accesses to the memory 228. The use of the arbiter 220 is not mandatory, and the apparatus of FIG. 2 may not comprise the arbiter 220. In that case, the processor 200 itself obtains the information of the write and read accesses to the memory 228. If there is no arbiter 220, the processor 200 allows the priority for the write operation over the read operation.

The counter 206 can be used to perform the up- or down-count needed to perform the write operations. In other words, the processor 200 employs the counter 206 with parallel load capabilities. According to an embodiment, the counter 206 may perform as follows: the counter 206 is initialized at the second lowest address $D_2$ among the memory addresses corresponding to the current code block (since the first part A of the memory slot with the lowest address $D_1$ will not be used). A modulo-4 counter 354 of FIG. 3B informs when altogether four triplets of softbits have been received. That is, three storage operations (3×3 softbits) have been performed and the fourth triplet received. When the modulo-4 counter 354 of FIG. 3B indicates that there is data to be written to the memory 228, the processor 200 (or the memory interface 208) arranges write-enable and bit-write-enable signals to implement the first part A write operation, while the processor 200 orders the counter 206 to up-count so as to get ready for the next address. After the counter 206 contents have reached $D_2+N/8$ (the predetermined threshold T), the processor 200 will order a down-count, while the processor 200 (or the memory interface 208) will arrange the bit-write-enable signals such that the second part B write operation takes place. After the counter 206 has reached the lowest address $D_1$ for the corresponding code block, the processor 200 will re-initialize the counter 206 to $D_2+N/8+1$ in preparation for the next code block.

The read operations may use a down-counter 216 with parallel load capabilities. The counter 216 may be initialized at $D_2+N/8$ (=N/8+1), as explained earlier. The processor 200 (or the memory interface 218) is informed about the presence of full slots/words in the memory 228 through a "data ready" flag. It is also informed if writing is being conducted, through a "write access" flag. If a write access is being performed, then reading will not be attempted, but the next free cycle will be waited for. Provided that "data ready" and "write access" suggest there are full words and they can be accessed, the processor 200 arranges the memory interface 218 to perform the read operation. Reading takes place at the address provided by the counter 216, which is thereafter instructed by the processor 200 to down-count in preparation for the next read operation.

As explained, the processor 200 will, according to an embodiment, count the number of write operations and read operations and obtain knowledge of a code block size. Based on the information, the processor 200 may determine if at least one of the following takes place: there is a full memory slot to be read, the memory is full, and the memory is empty. Based on the determination result, the processor 200 performs at least one of the following: controlling the reading of the full memory slot if there is one, restraining from receiving the at least one data sample if the memory is full, and controlling the informing of the empty memory.

In other words, if there is a full memory slot to be read, the processor 200 controls the reading of the memory slot. It may, for example, raise the "data ready" flag. Further, if the memory 228 is full and the loader cannot accept more data samples from HARQ, the processor may give an overflow indication via a control line 203. However, if the memory 228 is totally empty (in the sense that all words have been read and propagated further), the processor 200 raises a special "empty" flag via a control line 205 that can be useful internally to the rest of the design (equivalent to a FIFO Empty flag provided by conventional FIFO-type memories). In addition, when the memory 228 is accessed for writing, the processor 200 propagates the information (by means of the "write access" flag), so that reading access is not attempted at same time.

The processor 200 may also prevent writing to a memory slot whose content has not been read yet. The processor 200 may in this case raise the "overflow" signal via the control line 203 to the HARQ so that the HARQ stops sending softbits until there is empty memory space (at least one slot is read). The processor 200 may also perform at least one of the following: restraining the reading the memory 228 if the memory 228 is being written and restraining writing to the memory 228 if the memory 228 is being read, to avoid collision.

Even though FIG. 2 shows two memory interfaces 208 and 218, they may not be needed if the processor 200 has direct access to the memory 228. Even though most of the description refers to the example of three softbits per trellis column and each memory slot being able to store the contents of eight trellis columns, the exact same implementation principles would apply if the HARQ provided softbits, for example, one by one rather than in triplets. In that case, the register 204 of FIG. 3B would be a little different and the memory would be accessed for writing once every twelve cycles (assuming that in this example too one part of a memory slot can store 12 softbits).

FIG. 5 shows a method for rearranging data according to an embodiment of the invention. The method starts in step 500. In step 502, at least one data sample over a predetermined number of clock cycles is received. Step 504 comprises writing the received during least one data sample to a memory comprising one or more memory slots at the last clock cycle of each predetermined number of clock cycles such that first parts of a predetermined one or more memory slots are filled in an ascending order of addresses and, after the predetermined one or more memory slots are filled in respect of the first part, second parts of the predetermined one or more memory slots are filled in a descending order of addresses, wherein a part of a memory slot stores the at least one data sample received over the predetermined number of clock cycles. Step 506 comprises reading the written data samples from the predetermined one or more memory slots in a descending order once the first part and the second part of at least one memory slot are written, wherein the reading takes place during the clock cycles when data is not being written to the memory. As a result, when monitored, for example, over the period it takes for the data loader to receive data corresponding to one code block, writing and reading of the data happens in parallel. In step 508, the read data samples are forwarded from the predetermined one or more memory slots. The method ends in step 510.

FIG. 6 shows a method for rearranging data according to an embodiment of the invention. The method starts in step 600. In step 602, at least one data sample over a predetermined number of clock cycles are received. Step 604 comprises controlling the writing of the received at least one data sample to a memory comprising one or more memory slots during the last clock cycle of each predetermined number of clock cycles such that first parts of a predetermined one or more memory slots are filled in an ascending order of addresses and, after the predetermined one or more memory slots are filled in respect of the first part, second parts of the predetermined one or more memory slots are filled in a descending order of addresses, wherein a part of a memory slot stores the at least one data sample received over the predetermined number of clock cycles. Step 606 comprises controlling the reading of the written data samples from the predetermined one or more memory slots in descending order once the first part and the second part of at least one memory slot are written, wherein the reading takes place during the clock cycles when data is not being written to the memory. In step 608, the read data samples are forwarded from the predetermined one or more memory slots. The method ends in step 610.

The embodiments of the invention offer many advantages. Simultaneous writing and reading in the sense that data is being read while there still is at least one empty memory slot regarding the second parts among the memory slots reserved for the current code block, saves a significant number of clock cycles in the overall operation without imposing any particular requirement on the buffer memory (i.e., it does not have to be of a dual-port type). In the embodiment, where one memory slot occupies eight trellis columns, the saved clock cycles equals to N/8 clock cycles, which is the time that would otherwise be needed if writing and reading were not working in parallel as described but one after the other. Further, with the proposed solution, there will be no simultaneous read and write access attempts during one clock cycle.

Another advantage of the current solution is that otherwise the possibility of adding an extra turbo core to the design would have to be considered in order to achieve the throughput required by the LTE. That would significantly impact space/cost and power consumption.

The techniques and methods described herein may be implemented by various means. For example, these techniques may be implemented in hardware (one or more devices), firmware (one or more devices), software (one or more modules), or combinations thereof. For a hardware implementation, the apparatus of FIG. 2 may be implemented within one or more application-specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. For firmware or software, the implementation can be carried out through modules of at least one chip set (e.g., procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems described herein may be rearranged and/or complemented by additional components in order to facilitate the achieving of the various aspects, etc., described herein, and they are not limited to the precise configurations set forth in the given figures, as will be appreciated by one skilled in the art.

Thus, according to an embodiment, the apparatus for performing the tasks of FIGS. 2 to 6 comprises interfacing means for receiving at least one data sample over a pre-determined number of clock cycles, processing means for writing the received during least one data sample to a memory comprising one or more memory slots at the last clock cycle of each predetermined number of clock cycles such that first parts of a predetermined one or more memory slots are filled in an ascending order of addresses and, after the predetermined one or more memory slots are filled in respect of the first part, second parts of the predetermined one or more memory slots are filled in a descending order of addresses, wherein a part of a memory slot stores the at least one data sample received over the predetermined number of clock cycles; processing means for reading the written data samples from the predetermined one or more memory slots in a descending order once the first part and the second part of at least one memory slot are written, wherein the reading takes place during the clock cycles when data is not being written to the memory; and interfacing means for forwarding the read data samples from the predetermined one or more memory slots.

Embodiments of the invention may be implemented as computer programs in the apparatus of FIG. 2 according to the embodiments of the invention. The computer programs comprise instructions for executing a computer process for providing a solution for more efficient data arrangement for a decoder. The computer program implemented in the processor may carry out, but is not limited to, the tasks related to FIGS. 2 to 6.

The computer program may be stored on a computer program distribution medium readable by a computer or a processor. The computer program medium may be, for example but not limited to, an electric, magnetic, optical, infrared or semiconductor system, device or transmission medium. The computer program medium may include at least one of the following media: a computer readable medium, a program storage medium, a record medium, a computer readable memory, a random access memory, an erasable programmable read-only memory, a computer readable software distribution package, a computer readable signal, a computer readable telecommunications signal, computer readable printed matter, and a computer readable compressed software package.

Even though the invention has been described above with reference to an example according to the accompanying drawings, it is clear that the invention is not restricted thereto but can be modified in several ways within the scope of the appended claims. Further, it is clear to a person skilled in the art that the described embodiments may, but are not required to, be combined with other embodiments in various ways.

The invention claimed is:

1. A method comprising:
receiving at least one data sample over a predetermined number of clock cycles;
writing the received at least one data sample to a memory comprising one or more memory slots during the last clock cycle of each predetermined number of clock cycles such that first parts of a predetermined one or more memory slots are filled in an ascending order of addresses and, after the predetermined one or more memory slots are filled in respect of the first part, second parts of the predetermined one or more memory slots are filled in a descending order of addresses, wherein a part of a memory slot stores the at least one data sample received over the predetermined number of clock cycles;
reading the written data samples from the predetermined one or more memory slots in a descending order of addresses once the first part and the second part of at least one memory slot are written, wherein the reading takes place during the clock cycles when data is not being written to the memory; and
forwarding the read data samples from the predetermined one or more memory slots.

2. The method of claim 1, further comprising:
receiving at least one data sample over a predetermined number of clock cycles, wherein the at least one data sample corresponds to a part of a code block.

3. The method of claim 2, further comprising:
writing the received at least one data sample to the first part of a specific memory slot during the last clock cycle of each predetermined number of clock cycles;
incrementing an address of the specific memory slot in which the received at least one data sample is written during the last clock cycle of each predetermined number of clock cycles until the number of write operations reaches a predetermined threshold; and
decrementing the address of the specific memory slot in which the received at least one data sample is written during the last clock cycle of each predetermined number of clock cycles after the predetermined threshold is reached and until the data samples corresponding to the current code block are written.

4. The method of claim 2, further comprising:
reading the written data samples from at least one memory slot starting with the memory slot having an address corresponding to the predetermined threshold while at least one second part of the predetermined one or more memory slots is empty; and
decrementing the address of the memory slot which is read until the data samples corresponding to the current code block are read.

5. The method of claim 2, further comprising:
receiving at least one data sample relating to another code block; and
performing write and read operations for the code block such that writing is started from a memory slot with an address, which corresponds to the predetermined threshold in the last code block and is incremented by one.

6. The method of claim 2, further comprising:
writing the first received at least one data sample to the first part of the memory slot with the second lowest address among the addresses used for the data samples corresponding to the current code block;
receiving at least one tail data sample corresponding to the current code block; and
writing the received at least one tail data sample to the second part of the memory slot with the lowest address among the addresses used for the current code block.

7. The method of claim 1, wherein the at least one data sample comprises at least one of the following: at least one systematic bit and at least one parity bit.

8. The method of claim 1, further comprising:
Storing, in a temporary register, the at least one data sample received over the predetermined number of clock cycles minus one.

9. The method of claim 1, further comprising:
counting the number of write operations and read operations;
obtaining knowledge of a code block size;
determining if at least one of the following takes place: there is a full memory slot to be read, the memory is full, and the memory is empty; and
performing at least one of the following: controlling the reading of the full memory slot if there is one, restraining from receiving the at least one data sample if the memory is full, and controlling the informing of the empty memory.

10. An apparatus, comprising
an interface configured to receive at least one data sample over a predetermined number of clock cycles; the apparatus further comprising a processor configured to:
write the received at least one data sample to a memory comprising one or more memory slots during the last clock cycle of each predetermined number of clock cycles such that first parts of a predetermined one or more memory slots are filled in an ascending order of addresses and, after the predetermined one or more memory slots are filled in respect of the first part, second parts of the predetermined one or more memory slots are filled in a descending order of addresses, wherein a part of a memory slot stores the at least one data sample received over the predetermined number of clock cycles; and to read the written data samples from the predetermined one or more memory slots in a descending order of addresses once the first part and the second part of at least one memory slot are written, wherein the reading takes place during the clock cycles when data is not being written to the memory; and the interface is further configured to:

forward the read data samples from the predetermined one or more memory slots.

11. The apparatus of claim 10, wherein the at least one data sample corresponds to a part of a code block.

12. The apparatus of claim 11, wherein the processor is further configured to:

write the received at least one data sample to the first part of a specific memory slot at the last clock cycle of each predetermined number of clock cycles;

increment an address of the specific memory slot in which the received at least one data sample is written during the last clock cycle of each predetermined number of clock cycles until the number of write operations reaches a predetermined threshold; and decrement the address of the specific memory slot in which the received at least one data sample is written during the last clock cycle of each predetermined number of clock cycles after the predetermined threshold is reached and until the data samples corresponding to the current code block are written.

13. The apparatus of claim 11, wherein the processor is further configured to:

read the written data samples from at least one memory slot starting with the memory slot having an address corresponding to the predetermined threshold while at least one second part of the predetermined one or more memory slots is empty; and decrement the address of the memory slot which is read until the data samples corresponding to the current code block are read.

14. The apparatus of claim 11, wherein the first interface is further configured to:

receive at least one data sample relating to another code block; and the processor is further configured to:

perform write and read operations for the code block such that writing is started from a memory slot with an address which corresponds to the predetermined threshold in the last code block and is incremented by one.

15. The apparatus of claim 11, wherein the processor is further configured to:

write the first received at least one data sample to the first part of the memory slot with the second lowest address among the addresses used for the data samples corresponding to the current code block; and the interface is further configured to:

receive at least one tail data sample corresponding to the current code block; and the processor is further configured to:

write the received at least one tail data sample to the second part of the memory slot with the lowest address among the addresses used for the current code block.

16. The apparatus of claim 10, wherein the at least one data sample comprises at least one of the following: at least one systematic bit and at least one parity bit.

17. The apparatus of claim 10, wherein the processor is further configured to:

store to a temporary register the at least one data sample received over the predetermined number of clock cycles minus one.

18. The apparatus of claim 10, wherein the processor is further configured to:

count the number of write operations and read operations;

obtain knowledge of a code block size;

determine if at least one of the following takes place: there is a full memory slot to be read, the memory is full, and the memory is empty; and to perform at least one of the following: controlling the reading of the full memory slot if there is one, restraining from receiving the at least one data sample if the memory is full, and controlling the informing of the empty memory.

19. An apparatus, comprising:

interfacing means for receiving at least one data sample over a predetermined number of clock cycles;

processing means for writing the received at least one data sample to a memory comprising one or more memory slots during the last clock cycle of each predetermined number of clock cycles such that first parts of a predetermined one or more memory slots are filled in an ascending order of addresses and, after the predetermined one or more memory slots are filled in respect of the first part, second parts of the predetermined one or more memory slots are filled in a descending order of addresses, wherein a part of a memory slot stores the at least one data sample received over the predetermined number of clock cycles;

processing means for reading the written data samples from the predetermined one or more memory slots in descending order of addresses once the first part and the second part of at least one memory slot are written, wherein the reading takes place during the clock cycles when data is not being written to the memory; and interfacing means for forwarding the read data samples from the predetermined one or more memory slots.

* * * * *